United States Patent [19]

Chang

[11] Patent Number: 5,786,244
[45] Date of Patent: Jul. 28, 1998

[54] METHOD FOR MAKING GAAS-INGAAS HIGH ELECTRON MOBILITY TRANSISTOR

[75] Inventor: Chun Yen Chang, Hsinchu, Taiwan

[73] Assignee: National Science Council, Taipei, Taiwan

[21] Appl. No.: 770,183

[22] Filed: Dec. 19, 1996

Related U.S. Application Data

[63] Continuation-in-part of Ser. No. 315,431, Sep. 30, 1994, abandoned.

[51] Int. Cl.⁶ .................................................. H01L 21/338
[52] U.S. Cl. .......................... 438/172; 438/191; 438/269; 438/271; 257/194
[58] Field of Search .................................... 438/167, 172, 438/191, 268, 269, 270, 271; 257/194

[56] References Cited

U.S. PATENT DOCUMENTS 5,105,241  4/1992  Ando .................................. 357/22
5,206,527  4/1993  Kuwata .............................. 257/191
5,250,822  10/1993  Sonoda et al. ................... 257/194

*Primary Examiner*—John Niebling
*Assistant Examiner*—Long Pham
*Attorney, Agent, or Firm*—Lackenbach Siegel Marzullo Aronson & Greenspan, PC

[57] ABSTRACT

A GaAs-InGaAs high electron mobility transistor includes: a GaAs substrate; a GaAs buffer layer overlaying on the GaAs substrate; a graded InGaAs channel overlaying on the GaAs layer; a GaAs spacer layer overlaying on the graded InGaAs channel layer; a δ-doping layer overlaying on the GaAs spacer layer; a GaAs cap layer overlaying on the δ-doping layer; drain and source terminals overlaying on the GaAs cap layer and contacting the graded InGaAs channel layer; and a gate terminal overlaying on the GaAs cover layer and located between the drain terminal and the source terminal.

4 Claims, 4 Drawing Sheets

METHOD FOR MAKING GAAS-INGAAS
HIGH ELECTRON MOBILITY TRANSISTOR

This is a continuation-in-part of application Ser. No. 08/315,431 filed on Sep. 30, 1994, now abandoned.

BACKGROUND OF THE INVENTION

The present invention relates generally to a GaAs-InGaAs high electron mobility transistor, and more particularly to a δ-doping GaAs/InGaAs/GaAs pseudomorphic high electron mobility transistor.

To date, most reports have concentrated on AlGaAs/InGaAs modulation-doped high electron mobility transistors (HEMT) with superior element property the pseudomorphic structure of which is grown by use of the Molecular Beam Epitaxy (MBE) technique. The main reasons for this are better bandgap discontinuity, channel mobility and saturation velocity, which result in higher 2-dimensional electron gas concentration than GaAs/InGaAs MOSFET. However, this prior art has the following drawbacks: (1) In $Al_xGa_{1-x}As$, when the x content exceeds 0.2, defects (i.e. DX centers) occur. (2) The molecular-beam epitaxy (MBE) method cannot grow in mass production, while the metal organic chemical vapor deposition (MOCVD) method can produce massively but cannot produce a high-quality AlGaAs epilayer. (3) Although its transconductance is high, its gate operating voltage is always limited to 1 volt or less, and therefore cannot be used effectively in linear amplification.

The drawbacks mentioned above limit the practical applications of pseudomorphic AlGaAs/InGaAs transistors.

SUMMARY OF THE INVENTION

In view of shortcomings as described above, it is an object of this invention to present two new high performance δ-doped GaAs/InGaAs/GaAs pseudomorphic high electron mobility transistors (δ-HEMTs). One utilizes a graded InGaAs channel, while the other uses double δ-doped GaAs layers grown symmetrically on both sides of the InGaAs channel, to successfully fabricate, for the first time, δ-HEMTs grown by low-pressure metalorganic chemical vapor deposition (LP-MOCVD). These new structures reveal superior characteristics over conventional homogeneously doped GaAs/InGaAs/GaAs as indicated hereinbelow: (1) no DX centers, (2) using MOCVD for mass production, (3) high transconductance relaxes the limits on the gate operating voltage range.

Moreover, because the graded composition of this invention places carriers away from a doped layer interface, the mobility of electrons is raised, therefore enhancing the property of the transistors. The extrinsic transconductance and saturation current density are significantly superior to those of a conventional GaAs/InGaAs pseudomorphic structure.

BRIEF DESCRIPTION OF DRAWINGS

The present invention can be more fully understood by reference to the following detailed description and accompanying drawings, which form an integral part of this application, and wherein.

DETAILED DESCRIPTION OF PREFERRED EMBODIMENTS

The epilayers of this invention were grown on a (100)-oriented GaAs semi-insulating GaAs substrate by a computer-controlled LP-MOCVD. The conditions are listed in the following Table 1:

TABLE 1

| Chamber pressure | 80 Torr |
| --- | --- |
| Growth temperature | 650° C. |
| TEG (10° C.) flow rate | 5 cm³/min |
| TMI (10° C.) flow rate | 6.3 cm³/min |
| SiH₄ (500 ppm) flow rate | 100 cm³/min |
| AsH₃ (15%) flow rate | 0.08–0.12 l/min |

Wherein, trimethylindium (TMI), triethylgallium (TEG), arsine ($AsH_3$), and silane ($SiH_4$) were used as the In, Ga, As sources, and n-type of dopant, respectively. While the flow rates of $AsH_3$ were 0.12 l/min for InGaAs, and 0.08 l/min for GaAs.

Figure 1:
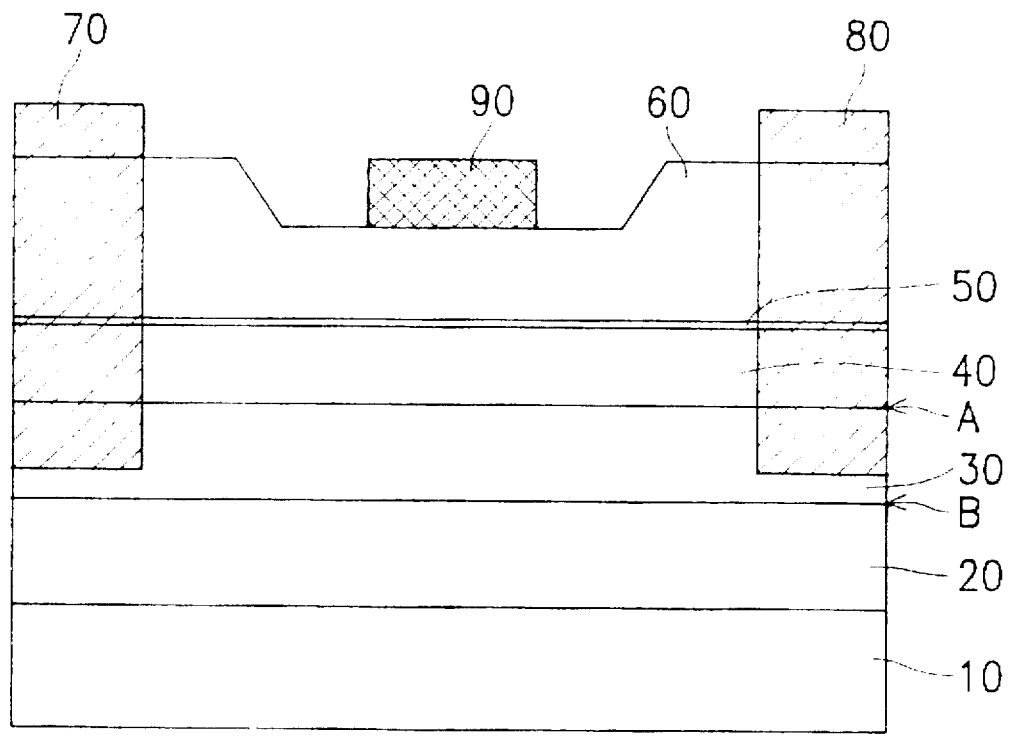
FIG. 1 is a cross-sectional diagram of a preferred embodiment.

Referring to FIG. 1, a preferred embodiment of this invention includes: a GaAs substrate 10; a graded InGaAs channel 30; a GaAs spacer layer 40; a δ-doped layer 50, in which the dopant is silicon; a GaAs cap layer 60; a source terminal 70; a drain terminal 80; and a gate terminal. The fabrication includes the following steps: (1) on an undoped GaAs substrate 10a, low-pressure metal-organic MOCVD is utilized to grow a GaAs buffer layer 20 of a thickness of about 5000 Å, a graded InGaAs channel 30 of a thickness of about 90 Å, a GaAs spacer layer 40 of a thickness of about 80 Å, a δ-doping layer 50, and a GaAs cap layer 60; (2) the finished epitaxy must be oriented before fabricated into the transistors, as it is feared that the HEMT may break during its process of fabricating gate metal; then the grease on the epitaxy surface is washed away; the positions of the drain and the source on the GaAs cap layer 60 are assigned; then the alloy of 88% gold and 12% germanium (Ge) is applied to the drain and the source, with a silver coating; finally it is placed into an oven of 450° C. for sintering, thus the drain terminal 80 and the source terminal 70 form an ohmic contact with the graded InGaAs channel 30; (3) a groove is made between source 70 and drain 80 to separate every element thus avoiding interference. This groove defines the place for the gate terminal 90 which is formed with a layer of gold.

The graded InGaAs channel 30 has a chemical composition in the form of $In_xGa_{1-x}As$, and x stands for the gradually varying amount of 0.2 at the interface A and 0.25 at interface B. This formation variation may be accomplished by computer-controlling the flow rates of TMI and TEG.

The graded channel obtained by the above method has the following features: (1) the carriers are located on the interface of the channel layer 30 and the buffer layer 20 which is separated from the δ-doped layer 50, thereby reducing the effect of ionized impurity scattering and enhancing the mobility; (2) the high concentration of carriers in the interface of the channel layer 30 and buffer layer 20, allow it to maintain high transconductance when reversely biased at the gate terminal 80.

Figure 2:
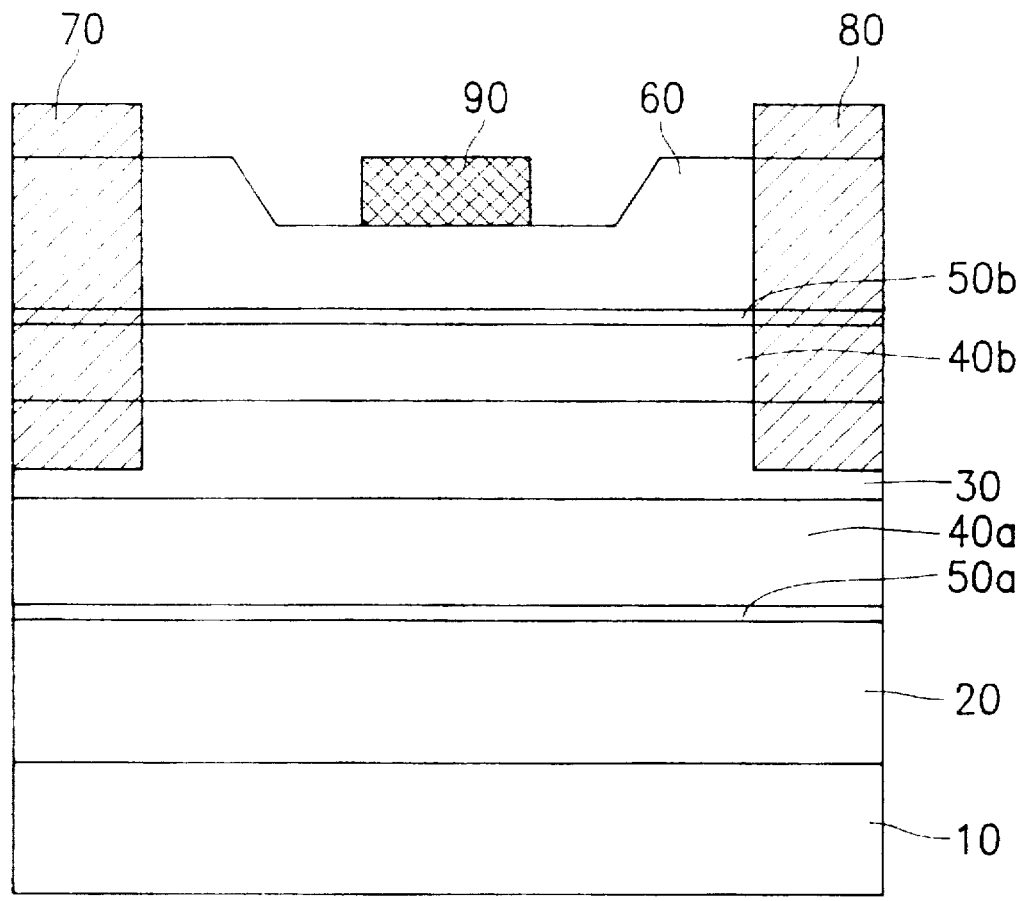
FIG. 2 is a cross-sectional diagram of another preferred embodiment.

Another embodiment of the invention as shown in FIG. 2 which replaces the graded InGaAs channel with a symmetric channel and includes the following: a GaAs substrate 10; a GaAs buffer layer 20; a first δ-doped layer 50a; a first GaAs spacer layer 40a; an InGaAs channel layer 30; a second GaAs spacer layer 40b; a second δ-doped layer 50b; a GaAs cap layer 60; a source terminal 70; a drain terminal 80, a gate terminal 90. The dopant of the first and second δ-doped layers 50a, 50b is silicon. Wherein the first δ-doped layer 50a, the first GaAs spacer layer 40a, the InGaAs channel layer 30, the second GaAs spacer layer 40b; and the second δ-doped layer 50b constitute the symmetrical δ-doped-channel structure that features: (1) double doping that enhances the concentration of 2-dimensional electrons and increases the transconductance in the gate voltage operating range; (2) because high concentration of 2-dimensional electrons means high mobility, as well as a saturation current density and transconductance that are very high.

The fabrication procedure for making symmetrical channel δ-doped transistors include the steps of: (1) according to the growth conditions of MOCVD, on an undoped GaAs substrate 10, growing a GaAs buffer layer 20 of a thickness about $10^4$ Å, a first δ-doping layer 50a, a first GaAs spacer layer 40a of a thickness of about 100 Å, an InGaAs channel layer 30 of a thickness of about 90 Å (wherein the composition is $In_{0.25}Ga_{0.75}As$), a second GaAs spacer layer 40b of a thickness of about 100 Å, a second δ-doping layer 50b, and a GaAs cap layer 60 of thickness about 400 Å; (2) the finished epitaxy must be oriented before being fabricated into the transistors; the grease on the epitaxial surface is also washed away; the positions of the drain and the source on the GaAs cap layer 60 are assigned; then the alloy of gold and germanium (Ge) is applied to the drain and the source, with a silver coating; finally it is placed into an oven of 450° C. for sintering, thus the drain terminal 70 and the source terminal 80 form an ohmic contact with the graded InGaAs channel 30; (3) a groove is made in the GaAs cap layer 60 between source 80 and drain 70. In this groove, the gate terminal 90 is formed by a layer of gold.

In the above embodiments the, growth of a δ-doping layer is based on the conditions listed in Table 1: closing TEG and letting $SiH_4$ and $AsH_3$ flow. The process takes about 0.2 minutes.

Figure 3:
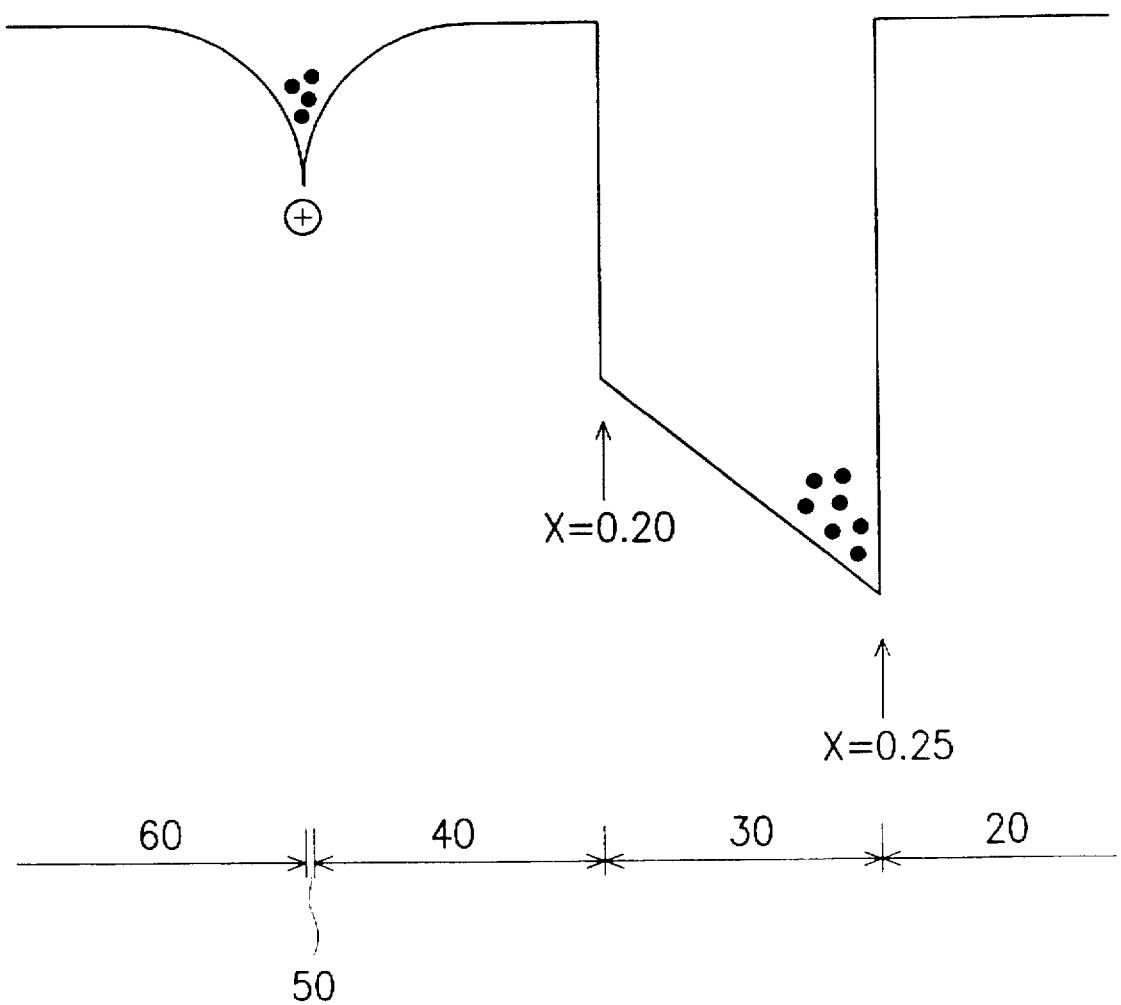
FIG. 3 is a diagram of a band gap adjacent to the channel of the high electron mobility transistor according to one preferred embodiment of this invention.
Figure 4:
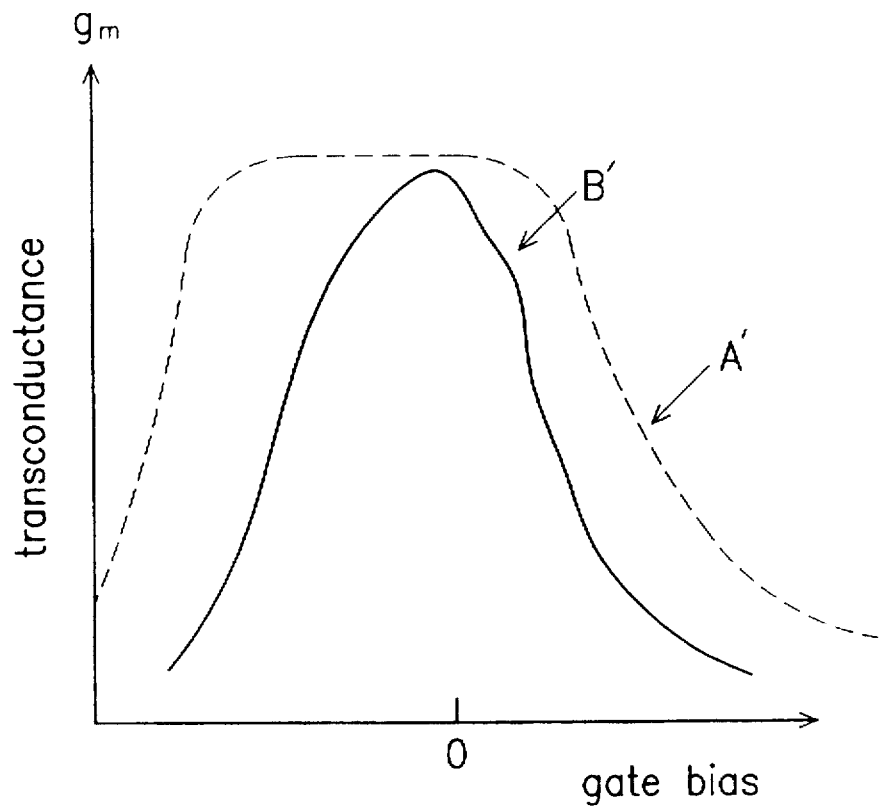
FIG. 4 is a curve diagram illustrating the relationship between transconductance and gate bias of this invention and conventional constructions of transistors.

As mentioned above, this invention employs a graded $In_xGa_{1-x}As$ layer as a channel layer, the channel layer having a chemical composition wherein X is 0.2 at the interface of the spacer layer and the $In_xGa_{1-x}As$ layer, and gradually increasing to 0.25 at the interface of the $In_xGa_{1-x}As$ layer and GaAs buffer layer. Referring to FIG. 3, which shows the band gap diagram adjacent to the channel of the high electron mobility transistor according to the preferred embodiment shown in FIG. 1, the construction and use of the embodiments of this invention are different from those of the prior-art constructions. This invention has the following advantages: (i) the mobility of the transistors made according to the invention, can be over 5000 $cm^2$/Vxsec at room temperature, which is apparently higher than conventional GaAs/InGaAs or AlGaAs/InGaAs structural transistors since the scattering from a δ-doped layer is effectively reduced by the construction of the invention. (ii) Referring to FIG. 4, which illustrates the curves of transconductance ($g_m$) vs. gate bias for this invention (indicated by curve A') and those of the prior art (indicated by curve B'), the depletion region is expanded forward to the interface of the InGaAs layer and the GaAs buffer layer while adding reverse gate bias. However, the transconductance of this invention remains almost unchanged, since, among other things, the saturation velocity (Vs) is larger, but not greatly declining with increasing reverse gate bias as is the case with the conventional prior art transistors. As a result, the gate voltage swing is greatly raised, which particularly makes the invention suitable for linear amplification applications.

The invention has been described above in terms of some important, preferred embodiments; however, this invention is not limited to the disclosed embodiments. On the contrary, for a person skilled in the art, it is intended to cover various modifications and similar arrangements included within the spirit and scope of the appended claims, the scope of which should be accorded the broadest possible interpretation so as to encompass all such modifications and similar structures and processes.

What is claimed is:

1. A method of fabricating a GaAs/InGaAs transistor comprising the steps of:

(i) sequentially growing a GaAs buffer layer, a graded InGaAs channel layer, a GaAs spacer layer, a δ-doping layer, and a GaAs cap layer on an undoped GaAs substrate by LP-MOCVD, wherein said InGaAs channel layer has a chemical composition in a form of $In_xGa_{1-x}As$, wherein x is 0.2 at the interface of the GaAs spacer layer and the graded InGaAs channel layer, and gradually increases to 0.25 at the interface of the graded InGaAs channel layer and the GaAs buffer layer;

(ii) forming a drain terminal and a source terminal on both sides of said GaAs cap layer, and sintering to a point that said drain and said source terminals contact said graded InGaAs channel layer;

(iii) forming a groove on said GaAs cap layer between said drain and said source terminals; and (iv) forming a gate terminal in said groove.

2. The method according to claim 1, wherein in step (i) the LP-MOCVD is implemented under the following conditions: the chamber pressure is about 80 torrs; the temperature is about 650° C.; the flow rates of Trimethylindium (TMI) at 10° C., and Triethylgallium (TEG) at 10° C., and $SiH_4$ are respectively 5 $cm^3$/min, 6.3 $cm^3$/min, and 100 $cm^3$/min, and the flow rates of $AsH_3$ are 0.12 l/min for growing the graded InGaAs channel layer and 0.08 l/min for growing GaAs layers, respectively.

3. The method according to claim 1, wherein the δ-doping layer is formed by closing TEG and letting $SiH_4$ and $AsH_3$ open for about 0.2 minutes in the method of fabricating the GaAs/InGaAs transistor.

4. A method of fabricating a GaAs/InGaAs transistor comprising the steps of:

(i) growing a GaAs buffer layer, a graded-in InGaAs channel layer having two spaced interface surfaces, a GaAs spacer layer, a δ-doping layer, and a GaAs cap layer on an undoped GaAs substrate, wherein said InGaAs channel layer has a chemical composition in the form of $In_xGa_{1-x}As$, wherein x stands for a gradually varying amount and is equal to 0.2 at one of said interface surfaces and is equal to 0.25 at the other of said interface surfaces;

(ii) forming a drain terminal and a source terminal on both sides of said GaAs cap layer, and sintering to the point that said drain and source terminals contact said InGaAs channel layer;

(iii) forming a groove on said GaAs cap layer between said drain and said source terminals; and (iv) forming a gate terminal in said groove.

* * * * *